(12) United States Patent
Martin et al.

(10) Patent No.: US 8,912,097 B2
(45) Date of Patent: Dec. 16, 2014

(54) METHOD AND SYSTEM FOR PATTERNING A SUBSTRATE

(75) Inventors: Patrick M. Martin, Ipswich, MA (US); Steven Carlson, Hampton Falls, NH (US); Choong-Young Oh, Gyeonggi-do (KR); Jung-Wook Park, Gyeonggi-do (KR)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 378 days.

(21) Appl. No.: 12/859,606

(22) Filed: Aug. 19, 2010

(65) Prior Publication Data
US 2011/0300711 A1 Dec. 8, 2011

Related U.S. Application Data

(60) Provisional application No. 61/235,383, filed on Aug. 20, 2009.

(51) Int. Cl.
*H01L 21/302* (2006.01)
(52) U.S. Cl.
USPC ............ 438/725; 438/708; 438/717; 430/312
(58) Field of Classification Search
USPC ......... 438/510, 514, 525, 696, 708, 709, 716, 438/717, 725; 430/312, 313, 314; 216/62, 216/66
See application file for complete search history.

(56) References Cited

U.S. PATENT DOCUMENTS

| 5,710,066 | A | * | 1/1998 | Okamoto et al. | ............... 216/46 |
| 5,876,903 | A | | 3/1999 | Ng et al. | |
| 6,423,475 | B1 | | 7/2002 | Lyons et al. | |
| 6,653,735 | B1 | | 11/2003 | Yang et al. | |
| 2003/0222345 | A1 | | 12/2003 | Kenyon et al. | |
| 2008/0131821 | A1 | * | 6/2008 | Sandstrom | ..................... 430/326 |
| 2008/0160774 | A1 | | 7/2008 | Kim et al. | |
| 2008/0305443 | A1 | | 12/2008 | Nakamura | |
| 2009/0098718 | A1 | * | 4/2009 | Knaipp et al. | ................. 438/537 |
| 2009/0239382 | A1 | * | 9/2009 | Zhu | ............................... 438/696 |

FOREIGN PATENT DOCUMENTS

| JP | 2000-235969 A | 8/2000 |
| JP | 2008-306144 A | 12/2008 |
| JP | 2009-055022 A | 3/2009 |

* cited by examiner

*Primary Examiner* — Lan Vinh

(57) ABSTRACT

A method of patterning a substrate comprises providing an array of resist features defined by a first pitch and a first gap width between adjacent resist features. Particles are introduced into the array of resist features, wherein the array of resist features becomes hardened. The introduction of particles may cause a reduction in critical dimension of the resist features. Sidewalls are provided on side portions of hardened resist features. Subsequent to the formation of the sidewalls, the hardened resist features are removed, leaving an array of isolated sidewalls disposed on the substrate. The sidewall array provides a mask for double patterning of features in the substrate layers disposed below the sidewalls, wherein an array of features formed in the substrate has a second pitch equal to half that of the first pitch.

17 Claims, 5 Drawing Sheets

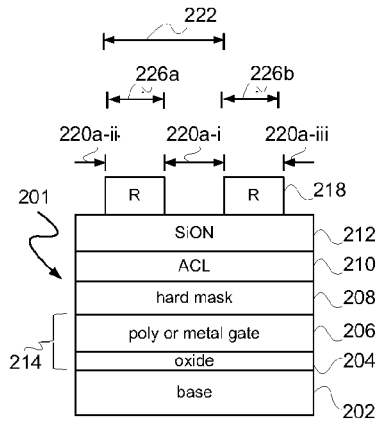
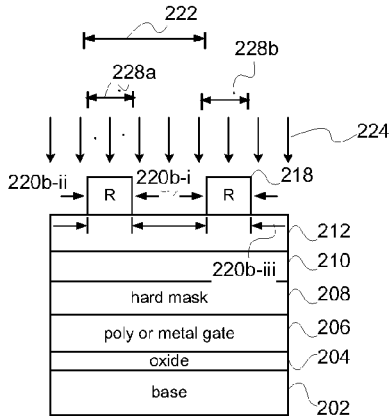
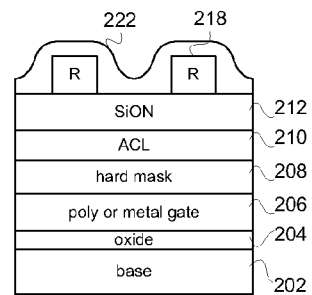
FIG. 2a    FIG. 2b    FIG. 2c
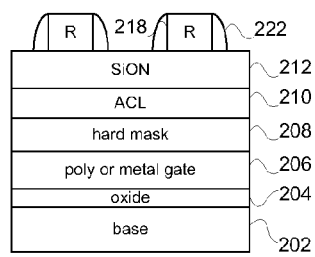
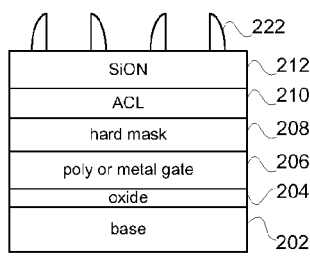
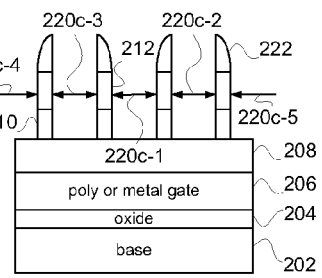
FIG. 2d    FIG. 2e    FIG. 2f
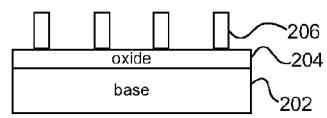
FIG. 2g
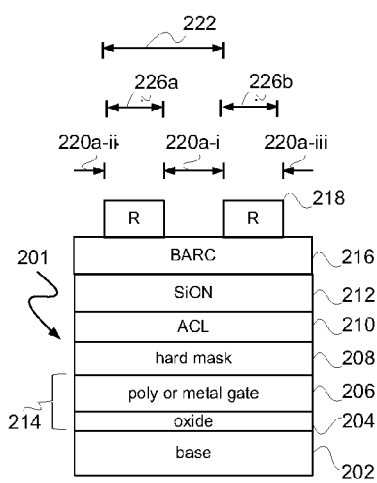
FIG. 2a1

METHOD AND SYSTEM FOR PATTERNING A SUBSTRATE

This application claims priority to U.S. provisional patent application Ser. No. 61/235,383, filed Aug. 20, 2009, and incorporated by reference herein in its entirety.

BACKGROUND OF THE INVENTION

1. Field of the Invention

Embodiments of the invention relate to the field of device manufacturing. More particularly, the present invention relates to a method, system and structure for patterning a substrate for manufacturing a device.

2. Discussion of Related Art

In forming electronic devices, patterning processes are widely used. As known in the art, there exist various types of patterning processes. One example of the process is a photolithographic patterning process by which a pattern of desired resolution is transferred optically from an optical mask to a photoresist layer deposited onto the substrate and, ultimately, to the substrate. In one example, patterning has been used on a substrate to form the gate of a field effect transistor.

With continuing miniaturization of electronic devices, there is an increased need for a patterning process capable of achieving finer resolution. However, limitations in forming a mask with a desired resolution and having compatibility with the properties (e.g. wavelength) of the radiation used in the patterning process have led to difficulties in achieving patterns with the desired resolution. To overcome such difficulties, several techniques have been proposed. One of such techniques proposes using an electron beam to write the pattern directly onto the photoresist without using a mask. Although the technique is capable of forming the patterns with fine resolution, the process is very time consuming and costly. Other techniques propose using soft x-rays or extreme UV radiation, both examples of radiation with shorter wavelength than the currently used UV wavelengths, in order to form the mask having desired pattern resolution and/or to transfer the pattern from the mask to the photoresist layer. However, soft x-rays or extreme UV radiation are difficult to manipulate using mirrors and/or optical lenses. In addition, using soft x-rays or extreme UV radiation to pattern a substrate may have undesirable optical effects (e.g. self-interference) and may affect the definition of the pattern of the photoresist layer, thus adversely affecting the resolution of the patterned substrate.

Other techniques that are proposed to address the need for improved patterning processes include a self-aligned double patterning lithographic (SADPL) process. Referring to FIGS. 1a-k, there is shown a conventional SADPL process performed on a substrate 101 for forming gates of transistors. Each of FIGS. 1a-1k is a schematic cross-section of a substrate having a known stack of patterning layers designed for self-aligned double patterning. As illustrated in FIG. 1a, the substrate 101 may comprise silicon wafer 102, an oxide layer 104, and a polysilicon or metal layer 106.

A layer of hard mask film 108 may be deposited onto the substrate 108. On top of the hard mask film 101, a first amorphous carbon layer (ACL) film 110 may be deposited. Thereafter, a first SiON film 112 may be deposited. A second ACL film 114 may be deposited on the first SiON film 112. On the second ACL film 114, a second SiON film 116 may be deposited. Thereafter, a layer of photoresist film 118 may be deposited. After depositing the photoresist film 118, a primary lithographic process may be performed to pattern the photoresist film 118. As illustrated in FIG. 1a, the primary lithographic process may result in a patterned photoresist structure that comprises an array of islands separated from one another by gaps having a first width 120a. Islands 118 depict idealized cross-sections of patterned resist features, which may, in plan view, have the shape of elongated "lines," rectangles, squares, or other shapes. Moreover, islands 118 are typically arranged in an array having many such islands that are arranged similarly to those depicted in FIG. 1a.

Referring to FIG. 1b, the patterned photoresist islands may be trimmed via an etch trim process. As a result, the width of the gaps may be enlarged to a second width 120b and the feature size of the patterned photoresist islands may be adjusted to a desired feature size. Referring to FIG. 1c, the second SiON film 116 may then be etched so as to transfer the pattern of the patterned photoresist islands 118 to the second SiON film 116. Thereafter, the patterned photoresist islands 118 may be removed from the second SiON film 116 as illustrated in FIG. 1c.

Following the removal of the patterned photoresist islands 118 from the second SiON film 116, the second ACL film 114 may be etched, and the pattern of the second SiON film 116 may be transferred to the second ACL film 114 (FIG. 1e). Referring to FIG. 1f, the second SiON film 116 may be removed. After removing the second SiON film 116 from the patterned second ACL film 114, a layer of spacer film 122 may be deposited on to the patterned second ACL film 114 and the first SiON film 112 (FIG. 1g). A blanket etchback process may be performed to the layer of spacer film 122, resulting in spacers 122 disposed along the sidewall of the patterned second ACL film 114 (FIG. 1h).

The patterned second ACL film 114 may then be removed (FIG. 1i), and the first SiON film 112 and the first ACL film 110 may be etched (FIG. 1j) to form columns separated from one another by gaps having a third width 120c. Thereafter, the hard mask layer 108 and the poly or metal gate layer 106 of the substrate 101 may be etched so as to transfer the pattern the columns shown in FIG. 1j. The hard mask layer 108 is subsequently removed from the poly or metal gate layer 106, and a patterned substrate 101 having the poly or metal gate layer 106 of desired feature size may be formed, as depicted in FIG. 1k.

The conventional SADPL method, although adequate, has several shortcomings. For example, the etch trim process used in the conventional SADPL process to trim the patterned photoresist 118 may not be precise and may be difficult to control. In addition, the conventional SADPL process requires multiple deposition steps to deposit multiple layers of ACL and SiON films and multiple etching steps to etch the films. The technique, therefore, is costly and inefficient. Such inefficient processes may place undue financial burden on the manufacturers of the devices and, ultimately, the consumers. Accordingly, new techniques for patterning a substrate are needed.

SUMMARY OF THE INVENTION

Embodiments of the present invention are directed to methods and structures for patterning a substrate. In an exemplary embodiment, a method of patterning a substrate comprises providing an array of resist features defined by a first pitch and a first gap width. Particles are introduced into the array of resist features, wherein the array of resist features becomes hardened. The particles may be energetic charged or neutral species, and may be either atoms or molecules or subatomic species. Sidewalls are provided on side portions of the hardened resist features, and the hardened resist features are subsequently removed, leaving an array of isolated sidewalls disposed on the substrate. The array of sidewalls is used to form an array of features in the substrate such that the substrate array has a pitch that is half that of the array of resist features. In some embodiments of the present invention, the critical dimension of the resist features may also be adjusted by controlling parameters such as particle dose, particle energy, substrate tilt and substrate twist.

BRIEF DESCRIPTION OF THE DRAWINGS

FIG. 2a is a schematic cross-section of a substrate having a stack of patterning layers including a top, patterned photoresist layer, in accordance with an embodiment of the present disclosure.

FIG. 2a1 is a schematic cross-section of a substrate having a stack of patterning layers including a top, patterned photoresist layer, and a bottom antireflection coating, in accordance with an embodiment of the present disclosure.

FIG. 2b is a schematic cross-section of the substrate of FIG. 2a when subject to particle bombardment, in accordance with an embodiment of the present disclosure.

FIG. 2c is a schematic cross-section of the substrate of FIG. 2b after deposition of a sidewall-forming layer, in accordance with an embodiment of the present inv disclosure.

FIG. 2d is a schematic cross-section of the substrate of FIG. 2c after sidewall formation, in accordance with an embodiment of the present disclosure.

FIG. 2e is a schematic cross-section of the substrate of FIG. 2d after removal of the patterned photoresist, in accordance with an embodiment of the present disclosure.

FIG. 2f is a schematic cross-section of the substrate of FIG. 2e after patterning of SiON and ACL layers disposed beneath the sidewalls, in accordance with an embodiment of the present disclosure.

FIG. 2g is a schematic cross-section of the substrate of FIG. 2f after patterning of a hard mask layer and lower substrate layer and after removal of the patterned SiON, ACL, and hardmask layers, in accordance with an embodiment of the present disclosure.

DESCRIPTION OF EMBODIMENTS

Figure 1A:
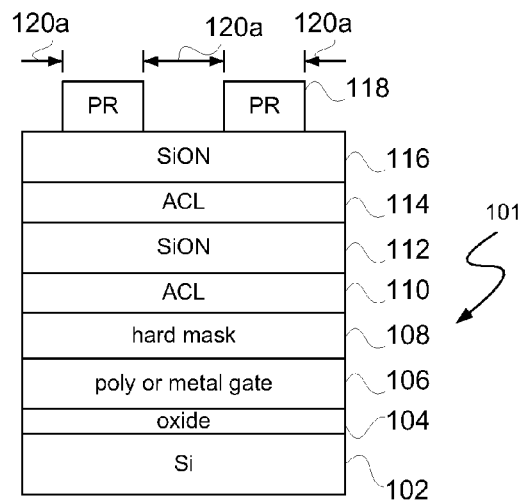
FIG. 1a is a schematic cross-section of a substrate having a known stack of patterning layers designed for self-aligned double patterning.
Figure 1B:
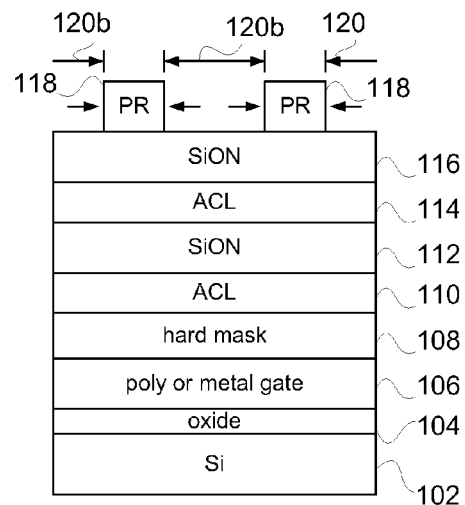
FIG. 1b is a schematic cross-section of the substrate of FIG. 1a after resist trimming.
Figure 1C:
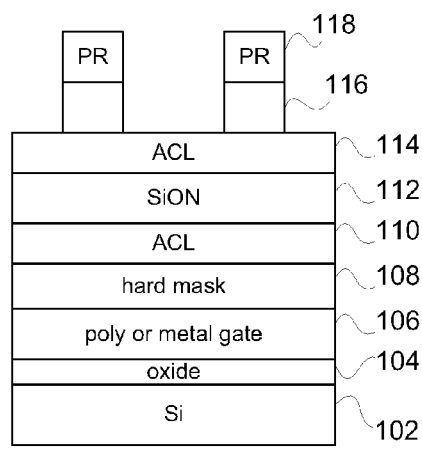
FIG. 1c is a schematic cross-section of the substrate of FIG. 1b after patterning of a top SiON layer.
Figure 1D:
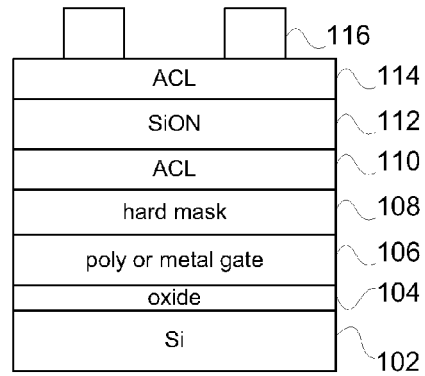
FIG. 1d is a schematic cross-section of the substrate of FIG. 1c after removal of the photoresist.
Figure 1E:
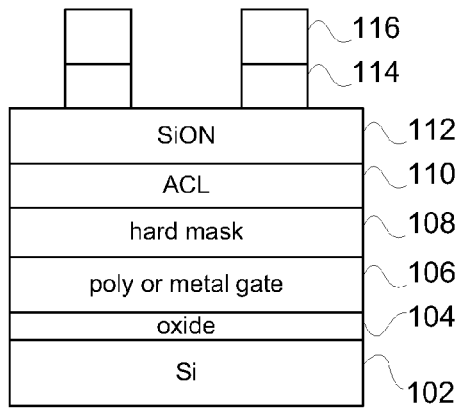
FIG. 1e is a schematic cross-section of the substrate of FIG. 1d after patterning of a top ACL layer.
Figure 1F:
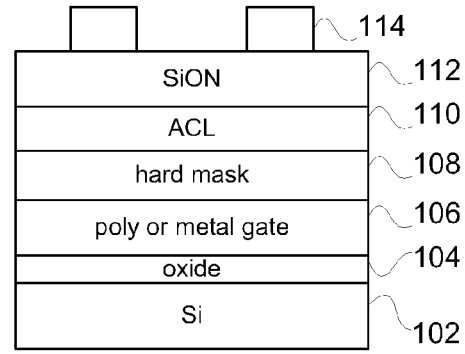
FIG. 1f is a schematic cross-section of the substrate of FIG. 1e after removal of the top SiON layer.
Figure 1G:
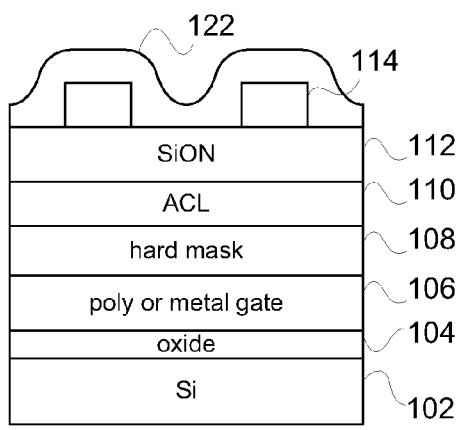
FIG. 1g is a schematic cross-section of the substrate of FIG. 1f after deposition of a sidewall-forming layer.
Figure 1H:
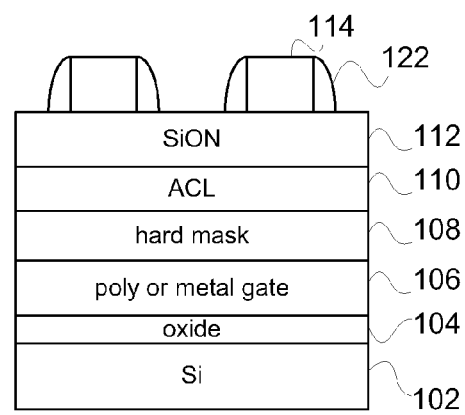
FIG. 1h is a schematic cross-section of the substrate of FIG. 1g after formation of sidewalls.
Figure 1I:
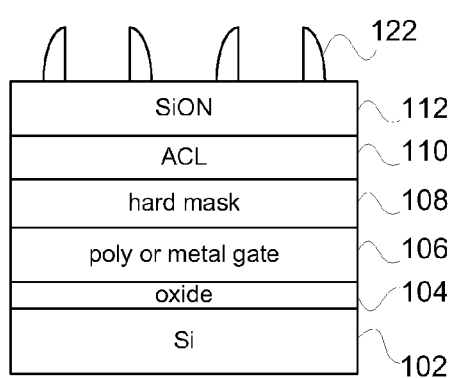
FIG. 1i is a schematic cross-section of the substrate of FIG. 1h after removal of the top ACL patterned portions.
Figure 1J:
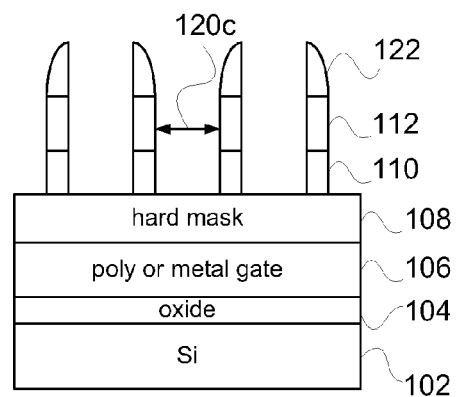
FIG. 1j is a schematic cross-section of the substrate of FIG. 1h after patterning second SiON and ACL layers disposed beneath the sidewalls.
Figure 1K:
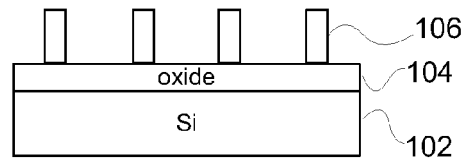
FIG. 1k is a schematic cross-section of the substrate of FIG. 1j after patterning of a hard mask layer and lower substrate layer and removal of the patterned second SiON, second ACL, and hardmask layers.

The present disclosure will now be described more fully hereinafter with reference to the accompanying drawings, in which preferred embodiments are shown. This disclosure, however, may be embodied in many different forms and should not be construed as limited to the embodiments set forth herein. Rather, these embodiments are provided so that this disclosure will be thorough and complete, and will convey the scope of the invention to those skilled in the art. In the drawings, like numbers refer to like elements throughout.

To solve the deficiencies associated with the methods noted above, novel and inventive techniques for patterning a substrate are introduced. For purposes of clarity and simplicity, the present disclosure focuses on techniques to pattern a substrate for forming transistors.

In particular, the present disclosure focuses on techniques involving SADPL processes for forming gates of transistors. However, those of ordinary skill in the art will recognize that the techniques disclosed herein are not limited to SADPL process. Instead, the present disclosure may be equally applicable to other types of patterning process.

In particular, novel methods, systems, and structures for performing self aligned double patterning of substrates using hardened and optionally trimmed photoresist features are disclosed herein. However, the present invention covers other patterning processes that can employ hardened and/or trimmed photoresist.

In addition, those of ordinary skill in the art should also recognize that the present disclosure is not limited to patterning a substrate for forming gates of the transistors. Instead, the present disclosure may be equally applicable to techniques for patterning a substrate for forming other parts of the transistors and/or other types of devices. For example, the techniques may be equally applicable to techniques for patterning a substrate to form a patterned magnetic bit data storage media. Accordingly, the term "substrate" used herein is not limited to semiconductor wafer. Herein, the term may be applicable to thermally and/or electrically conductive, insulating, semiconducting, substrates. The substrate may also be a doped or undoped substrate. In addition, the substrate may be a single element substrate, and/or a compound or an alloy based substrate. The substrate may also be applicable to that which may or may not exhibit external magnetism. Further, the substrate may be a single or multi-layer substrate. If the substrate is a multi-layer substrate, each layer may be thermally and/or electrically conductive, insulating, semiconducting; doped or undoped; comprising a single element and/or a compound or an alloy; and/or may or may not exhibit external magnetism.

The present disclosure may also describe the techniques using the term "particles" for purpose of simplicity and clarity. As used herein, the term "particles" refers to species that may be charged or neutral, sub-atomic, atomic, or molecular. Further, the techniques of the present disclosure may be described in context of a beam-line ion implantation system. However, those of ordinary skill in the art will recognize other systems capable of adding particles or material to the substrate may also be applicable. For example, a doping system including, but not limited to, a plasma assisted doping (PLAD) or plasma immersion ion implantation (PIII) system, or other types of doping system may also be used. Other types of processing systems capable of adding particles may also be used. Examples of such systems may include a furnace, chemical vapor deposition (CVD) system, plasma enhanced chemical vapor deposition (PECVD) system, atomic layer deposition (ALD) system, molecular beam epitaxy (MBE) system etc.

Referring to FIGS. 2a-g, there is shown a series of exemplary steps involved in a technique for patterning a substrate according to one embodiment of the present invention. Each of FIGS. 2a-2f depicts, at a particular stage of processing, a schematic cross-section of a stack of patterning layers 208-218 that are used to pattern a substrate 201. FIG. 2g illustrates in cross-section a final self-aligned double patterning structure transferred to substrate 201 after removal of the stack of patterning layers. The Figures may not be drawn to scale. In addition, the Figures show only a portion of the entire substrate.

As illustrated in FIG. 2a, the substrate 201 may comprise a base 202, and a lower portion 214, which, in turn, includes an oxide layer 204, and a polycrystalline or metal layer 206. In one embodiment, the base 202 may be a semiconducting layer such as, for example, a silicon wafer. In other embodiments, the base 202 may be made from another material. In addition, the polycrystalline or metal layer 206, in one embodiment, may be polysilicon or a multi-stack metal layer.

As illustrated in FIG. 2a, a layer of hard mask film 208 may be disposed on the substrate 201. On top of the hard mask film 208, a layer of ACL film 210 may be disposed. Thereupon, a layer of SiON film 212 may be disposed. On top of the SiON film 212, a layer of resist film 218 may be deposited. For example, a layer of photoresist film 218 may be deposited. Herein, the terms "photoresist" and "resist" are generally used interchangeably. However, the present invention covers systems and methods in which resists can be other than those used for optical lithography systems, such as electron beam resists. Optionally, before deposition of resist film 218, an antireflection coating, such as a bottom antireflection (BARC) coating 216 may be deposited on film 212, as illustrated in FIG. 2a1. Layer 216 can be, for example, a dielectric antireflection coating. BARC layer 216 is subject to implantation from energetic particles and may or may not be dry etched (RIE) prior to implantation. After depositing the resist film 218, a primary lithographic process may be performed to pattern the resist film 218. As illustrated in FIG. 2a, the primary lithographic process may produce patterned resist islands 218.

As with islands 118 depicted in FIG. 1a, islands 218 depict ideal cross-sections of patterned resist features that may appear in plan view as elongated "lines," rectangles, squares, or other shapes. Moreover, islands 218 can comprise an array having many such islands that are arranged similarly to those depicted in FIG. 2A. Islands 218 are separated by a first gap width 220a-i. Additionally, islands 218 are characterized by an array pitch (or simply, "pitch") 222. As used herein, the term "pitch" refers to a distance that is the sum of the value of the gap (or space) between adjacent islands and the width of an island. Thus, in FIG. 2a the pitch 222 comprises gap width 220a-i plus island width 226a, and is drawn from the left side of one island 218 to the left side of an immediately adjacent island 218. It will be readily appreciated by those of ordinary skill in the art that the pitch 222 could also be illustrated as the distance between centers of adjacent islands 218. In a regular array of islands, the pitch is constant between successive islands. Thus, in a regular array having, for example, hundreds, thousands, or millions, of islands, the nominal distance 222 is constant between respective centers of adjacent islands.

As depicted in FIG. 2a, islands 218 are characterized by gaps having first to third widths 220a-i to 220a-iii, respectively. Second width 220a-ii is intended to depict the gap between left-side island 218 and its immediately adjacent counterpart to the outside left (not shown). Similarly, third width 220a-iii is intended to depict the gap between right-side island 218 and its immediately adjacent counterpart to the outside right (not shown). In the present embodiment, the values of the first width 220a-i to the third width 220a-iii may be the same or different, or a combination thereof. This is because, although the center-to center distance (pitch) 222 may be constant between successive sets of adjacent islands 218, the actual widths (for example, 226a and 226b) of individual islands 118 can vary, leading to a variation in successive gaps 220a between adjacent islands In accordance with embodiments of the present invention, the structure depicted in FIG. 2a is exposed to particles in order to alter the properties of resist islands 218. As described in more detail in the discussion to follow, parameters associated with the particles may be tailored in order to produce a desired set of properties in resist islands 218. Examples of such properties are a targeted island width (also termed "critical dimension," or "CD"), an increased hardening of the resist, and a profile of the resist. Unless otherwise noted, as used herein, the term "hardened" refers to an increase in resistance to degradation of the resist when the resist is exposed to processing conditions, including, but not limited to, elevated temperature, wet chemical solutions, and/or energetic species found in reactive ion etching (RIE) chambers. Resist degradation can entail softening or melting of the resist, etching of the resist, or decomposition of the resist, among other things. Examples of particle parameters that can be varied include particle dose, particle energy, and substrate (that is, resist feature) orientation with respect to the incident particle direction.

Referring to FIG. 2b, particles 224 containing a desired species may be introduced into the patterned resist islands 218, and the properties of the patterned resist islands 218 may be altered. For example, the patterned resist islands 218 may become hardened and less susceptible to extreme conditions by introducing the particles 224. In another example, the size of the patterned resist islands 218 may be altered. In the present embodiment, the patterned resist islands 218 may shrink such that the islands 218 are separated from one another by gaps having a fourth width to a sixth width 220b-i-220b-iii, where at least one of the fourth width to a sixth width 220b-i-220b-iii is greater than at least one of the first to third width 220b-i-220b-iii. The fourth to sixth width 220b-i-220b-iii of the gaps may be the same or different, or a combination thereof. In addition, the patterned resist islands 218 may shrink asymmetrically, to achieve greater shrinkage in the lateral direction than the vertical direction. In another embodiment, the particles 224 are introduced to enlarge the patterned resist islands 218 such that at least one of the respective fourth width to sixth width 220b-i-220b-iii is less than at least one of the respective first to third width 220a-i-220a-iii. Accordingly, by controlling the particle properties, resist islands 218 of desired properties and desired feature size may be formed.

In one embodiment, the particles 224 are preferably introduced in a form of an ion beam or a charged particle beam. In other embodiments, the particles 224 may be introduced in other forms (e.g. via deposition followed by thermal diffusion). If the particles 224 are introduced in the form of an ion or charged particle beam, the dose and energy of the particles may be tailored to control properties of islands 218. For example, it may be desirable to harden resist islands 218 in order to provide a resist that can withstand elevated temperatures without substantial distortion, melting, or chemical decomposition. Alternatively, or in addition, it may be desirable to provide a resist with increased resistance to wet chemical etching or plasma-induced etching or decomposition that can occur in a RIE chamber.

Figure 3B:
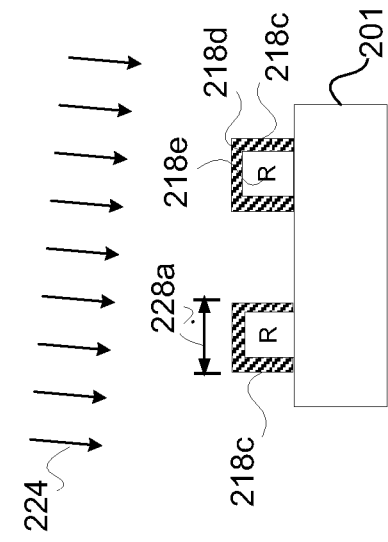
FIG. 3b is a schematic cross-section of a substrate that illustrates an alternate exemplary resist island structure formed using the process generally illustrated in FIG. 2b, in accordance with another embodiment of the present disclosure.
Figure 3A:
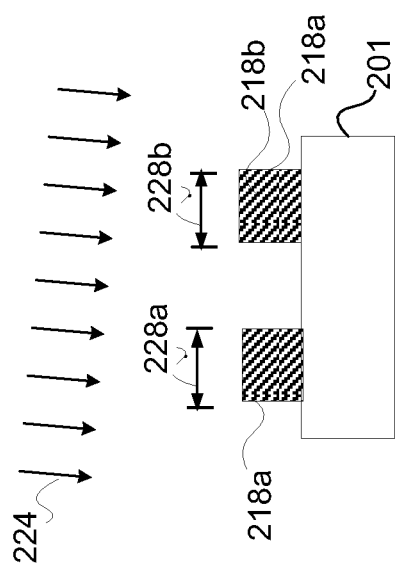
FIG. 3a is a schematic cross-section of a substrate that illustrates an exemplary resist island structure formed using the process generally illustrated in FIG. 2b, in accordance with an embodiment of the present disclosure.

In examples discussed in more detail below, islands 218 may be subjected to particle bombardment of sufficient energy and dose to provide islands 218 with a hardened portion that is effective in withstanding elevated temperatures and/or chemical attack and/or etching by reactive ions or other similar mechanisms. FIGS. 3a and 3b illustrate exemplary resist island structures formed using the process generally illustrated in FIG. 2b. The structure of resist islands 218a formed in FIG. 3a comprises a hardened portion 218b that extends throughout a resist island 218a. The structure of resist islands 218c formed in FIG. 3b includes hardened portions 218d and unhardened portions 218e. Hardened portions 218d are disposed in an outer region of side portions and in an upper portion of islands 218c. Unhardened portions 218e are disposed in an inner region of islands 218c and can extend to the bottom surface of islands 218c.

In an exemplary method, resist islands 218a are formed by selecting an appropriate energy and dose of particles to harden the entire island. For example, if the width 228a, 228b, and height (not indicated) of resist islands 218a is about 100 nm, a user can chose an appropriate particle energy of the particle species to be used to harden the resist islands, such that particles 224 penetrate throughout resist islands 218a. The particle range may be measured or calculated according to simulation programs. Similarly, an appropriate dose of particles can be selected to provide substantial hardening throughout each resist island 218a. Alternatively, it may be desirable to provide hardening only in an outer portion 218d of resist islands, as illustrated in FIG. 3b. For example, if it is known that the presence of an outer hardened layer 218d provides sufficient resistance to melting or distortion from subsequent thermal processing of resist islands, structure 218c may be an appropriate choice for resist islands 218. For resist islands having a given height and given widths 228a, 228b, this provides a further advantage in that layer 218d can be formed using lower energy particles as opposed to that required for formation of region 218b, because of the reduced particle penetration depth required to form outer region 218d. By reducing the particle energy employed to harden the resist, the heating of resist islands 218c during particle exposure can be reduced, thereby reducing the likelihood that the particles themselves induce melting or other mechanical distortion.

In the present invention, exemplary particle doses range from about $1 \times 10^{10}$ to about $5 \times 10^{17}$ particles/cm$^2$, preferably from about $7.5 \times 10^{14}$ to about $1.0 \times 10^{16}$ particles/cm$^2$. In addition, the dose of the particles may be uniform or varied. The optimum particle dose for hardening a resist island may vary in accordance with the particle mass, particle charge, energy, and other parameters of particles 224. However, in some embodiments, exemplary particle energies range between about 700 eV and 8 KeV. The optimum dose, energy, and particle species may also vary according to the type of photoresist and the exact formulation of the photoresist.

The optimum particle exposure for hardening resist features also can be tailored in accordance with island width and/or height. Resist island heights may be, for example, about 90 to 120 nm. As illustrated in the examples below, for a give final target CD, e.g., 25 nm, the particle energy and/or dose may be adjusted depending upon the starting CD of resist islands. Thus, a higher energy/dose combination may be selected in the case of 50 nm starting CD than for 30 nm starting CD. In one example using the same species —Ar— and a fixed dose in the low E15 ions/cm$^2$ range, for resist islands having a height of about 100 nm and starting CD value of about 50 nm, particle energies in the range of about 5 keV to 8 keV may be effective to achieve a final CD of 25 nm, while for starting CD values of about 30 nm particle energies in the range of about 1 keV to 3 keV may be effective to achieve a final CD of 25 nm for the same starting resist materials. In other examples, lower mass or higher mass particle species may be used, resulting in a relatively higher particle dose or a relatively lower particle dose, respectively, to cause the same reduction in resist island CD for a given particle energy.

As illustrated generally in FIGS. 2b, 3a, and 3b, the trajectory by which the particles 224 are introduced to the patterned resist islands 218 may also be controlled. In order to enable an effective sidewall spacer transfer process, it is useful to ensure that resist islands 218 do not lose an excessive amount of height during exposure to particles used to harden and/or trim the resist CD. In accordance with the present invention, one effective manner to accomplish this is to use a high substrate tilt with a slight twist during particle exposure. For example, either or both of twist angle and tilt angle of the substrate may be controlled in order to tailor properties of resist islands 218. As used herein, the term "tilt angle" refers to the angle between a beam of particles and the normal to the substrate surface; the term "twist angle" refers to the angle between a plane containing both the beam and the wafer normal, and another plane that is perpendicular to the substrate surface. In the case of silicon wafers, which have a primary flat or notch, the twist angle is generally defined as the angle between a plane containing both the beam and the wafer normal, and a plane that is perpendicular to the primary flat or notch of the wafer.

For example, the particles 224 may be introduced at one or more tilt angles ranging from about 0° (normal to top surface of the substrate 201) to about 90° (parallel to the top surface of the substrate 201), preferably from about 45° to 70. While introducing the particles 224, the incident angle may be maintained uniform or varied. If the beam-line ion implanter is used to introduce the particles 224, the substrate 201 may be tilted respect to the particle beam, or vice versa, to control the incident angle. In addition to tilting, the substrate may be rotated with respect to the beam, or vice versa. For example, the particle may be introduced from a first direction. Thereafter, the substrate may be rotated with respect to the first direction at a twist angle ranging from greater than 0° to about 90° so as to introduce the particles from a second direction. After introducing the particles from the second direction, the substrate may be rotated with respect to the first direction at a twist angle ranging from greater than 0° to about 90° so as to introduce the particles from a third direction. The process may be repeated until complete 360° rotation of the substrate.

As illustrated in FIGS. 3a and 3b, a non-normal particle tilt angle can be used to form either islands 218a or 218c. This may be useful to provide a hardened region along the sidewalls of the resist islands without having to use excess particle energy. For example, the use of normal incidence particles at a relatively lower energy could provide a desired hardened top region of the resist islands, but may fail to provide a hardened layer that extends along the sidewalls all the way to the bottom of the resist islands. In addition, it may not be desirable to use relatively higher particle energy at normal incidence to produce the uniformly hard structure of FIG. 3a. This is because for normal incidence bombardment, the higher particle energy that would be necessary to penetrate from top to the bottom of resist islands 218 may cause excessive heating, compaction or other undesirable side effects.

Referring again to FIGS. 3a and 3b, parameters such as particle energy, particle dose, substrate tilt, and/or substrate twist angles may be tailored to simultaneously produce a desired resist hardening and a desired resist trimming for islands 218 after exposure to particles 224. In one example, as illustrated in FIG. 3a, the widths 228a, 228b of resist islands 218a after exposure to particles 224 are less than the respective widths 226a, 226b of islands 218a before particle exposure, and resist islands 218 are fully hardened. In an alternative example illustrated in FIG. 3b, the widths 228a, 228b in islands after exposure to particles are reduced with respect to the respective widths 226a, 226b of unexposed islands, but only an outer portion 218d of resist islands 218c becomes hardened.

By choosing the correct combination of particle energy, particle flux, substrate tilt, and substrate twist, the final resist structure can be varied between that of islands 218a and that of islands 218c. For example, to form islands 218c, islands 218 of FIG. 2a may be subjected to the appropriate particle flux at an appropriate substrate tilt such that sufficient sputtering of the sidewalls of islands 218 takes place. Accordingly, the initial island widths 226 shown in FIG. 2a may be reduced to widths 228. Moreover, in order to ensure that the islands retain an unhardened interior 218e, the particle energy used to sputter the sidewalls may be selected such that the penetration depth into the resist islands is relatively low. In another example, separate steps for resist hardening and resist trimming may be employed. For instance, it may be desirable to use a different particle energy and/or dose and/or angle of incidence to perform resist trimming as opposed to resist hardening. Accordingly, the use of two separate steps provides the option to choose separate sets of particle exposure parameters that are properly tailored for each step.

In the present invention, the temperature of the resist 218 may also be controlled while introducing the particles 224. In one embodiment, the temperature of the resist 218 may be maintained at uniform or varied temperature that is below room temperature, preferably below 273° K. In another embodiment, the temperature of the resist 218 may be maintained at uniform or varied temperature that is above room temperature, but below the temperature at which the resist 218 begins to disintegrate or flow. Those of ordinary skill in the art will recognize that the temperature of the resist 218 may be controlled by controlling the temperature of, among others, the base 202.

Preferably, the particles 224 introduced to the resist 218 are those containing inert species, for example, Helium (He), Neon (Ne), Argon (Ar), Krypton (Kr), Xenon (Xe), Radon (Rn), Nitrogen (N), Carbon (C) and Oxygen (O). However, in other embodiments, particles containing other species may also be used. The particles containing other species may include those containing Silicon (Si), Boron (B), Carbon (C), Hydrogen (H), Iron (Fe), Lithium (Li), Chromium (Cr), Nickel (Ni), etc. In addition to elemental species, particles can be molecular species, such as carborane.

After introducing the particles 224 to form resist islands 218 having desired properties and feature size, spacer material 222 may be deposited onto the resist islands 218 and SiON film 212 (FIG. 2c). In embodiments of the invention, the spacer material 222 may be $SiO_2$, $Si_3N_4$, SiON, or $Si_x$-$O_yN_z$ based material. In other embodiments, other material including low temperature spacer material may also be used as the spacer material 222.

After depositing the spacer material 222, the substrate 201 may be etched back, such that the spacer material 222 is disposed along the sidewall of the resist 218 (FIG. 2d). By performing the etch back process, the portion of the resist 218 and portions of SiON film 212 (or portions of BARC layer 216, for the embodiment described with reference to FIG. 2A1) may be exposed. Because the resist features 218 are hardened in the step depicted in FIG. 2b, the shape of the resist islands 218 can remain intact during deposition and removal processes illustrated in FIGS. 2c and 2d. Accordingly, sidewalls 222 in FIG. 2d can be produced having uniform size, spacing, and shape.

To ensure producing the optimum sidewall structure of FIG. 2d, in an exemplary method, the particle exposure and sidewall deposition processes generally depicted in respective FIGS. 2b and 2c may be tailored in a coupled fashion. Because the formation of uniformly shaped and properly spaced sidewalls of FIG. 2d requires that the shape and size of islands 218 does not distort during deposition of spacer material 222, it is desirable that sidewalls 218 be hardened sufficiently to withstand the thermal budget (the combination of spacer deposition temperature and duration of deposition) imposed on the islands in the step of FIG. 2c. Accordingly, if the spacer deposition process is a relatively higher thermal budget process, then the particle exposure parameters employed in the step illustrated in FIG. 2b may be selected to induce a relatively higher degree of island hardening. Conversely, if the spacer deposition process is a relatively lower thermal budget process, the particle exposure parameters may be selected to induce a relatively lower degree of island hardening that is still sufficient to withstand the spacer deposition process.

Thereafter, the resist 218 is removed (FIG. 2e), and SiON film 212 and ACL film 210 are etched to the hard mask layer 208 to form columns separated from one another by gaps having seventh to eleventh widths 220c-1-220c-5 (FIG. 2f). Those of ordinary skill in the art will recognize that the seventh to eleventh widths 220c-1-220c-5 may be the same or different, or combination of both. In the process, the pattern of the spacers 210 may be transferred to SiON film 212 and ACL film 210. As illustrated in the figure, the spacers are double the number of resist islands for a given distance, and pitch doubling is therefore achieved.

Thereafter, the hard mask layer 208 and the polycrystalline or metal gate layer 206 of the substrate 201 may be etched so as to transfer the double pitch pattern of the sidewalls into layer 206, as shown in FIG. 2g. The hard mask layer 208 is subsequently removed from the polycrystalline or metal gate layer 206, and a patterned substrate 201 having the polycrystalline or metal gate layer 206 of desired feature size remains.

The exemplary structures and processing steps, such as those generally illustrated in FIGS. 2a-3b, may be implemented using a computer-based system or a similar data processing system (not shown). For example, a menu-driven interface may be provided in a computer screen, smart device, or similar device that is configured to accept user input. The menu may provide a "critical dimension" field that allows a user to enter a value in accordance with a desired CD. The entered value may be received by a processor, which invokes a program that is configured to output particle process parameters for the step shown in FIG. 2b. In one example, a user enters the nominal CD of resist islands in the step shown in FIG. 2a, as well as a target CD, which represents the desired CD after resist trimming. The program invoked then outputs an appropriate combination of parameters to be used in the particle exposure step of FIG. 2b, such as particle dose, particle energy, tilt angle, and/or other relevant parameters. The output parameters are then fed either manually or automatically into a tool, such as an ion implant tool, that is configured to perform the particle exposure step.

In another example, a user may enter an actual CD of resist islands before particle exposure. For example, after lithography steps are performed to pattern the photoresist into islands, the actual CD may be greater or less than the nominal CD due to errors in the lithography process. A user could use an in-line CD measurement tool to measure actual island CD. The program invoked then outputs an appropriate combination of parameters to be used in the particle exposure step based upon the actual CD, rather than a nominal CD, which may result in a slightly different particle dose, particle energy, etc., as compared to if the nominal CD were used. The present invention thus affords the ability to make real-time adjustments to particle exposure "recipes" so that a more accurate resist trim process can be performed that takes into account variability is the lithography process used to define the resist islands.

In another example, resist hardening may be required without any resist trimming. Accordingly, the same CD value is entered for fields corresponding to the before-particle-exposure CD and the after-particle-exposure CD. The program then outputs a recipe that can include a particle dose, particle energy, tilt angle, etc., which recipe is configured to provide resist hardening without substantial reduction in CD of the resist islands. In this example, the before-exposure and after-exposure values of CD can be based upon nominal or actual measured CD values, as discussed above.

In another example, a computer system may be configured to output a set of particle exposure parameters based upon the resist thermal budget. For example, a menu is provided to accept a value of a sidewall deposition temperature and duration for a sidewall deposition process that is to be performed subsequent to particle exposure, as discussed above with respect to FIG. 2c. For a higher temperature/duration sidewall process, a user enters a parameter that indicates the resist must withstand a high thermal budget and the program outputs particle exposure parameters that are configured to produce the "fully hardened" resist structure illustrated in FIG. 3a. For a lower temperature/duration sidewall process, the program outputs particle exposure parameters that are configured to produce the "partially hardened" resist structure illustrated in FIG. 3b.

The present technique for patterning the substrate may provide several advantages. For example, by controlling how the particles 224 are introduced to the resist 218, the properties of the resist 218 may be precisely controlled. By introducing the particles 224, the present technique may harden the resist 218 and enable the resist 218 to withstand extreme conditions associated with etching and deposition, processes involved in manufacturing the device. In addition, the angle by which the particles 224 are introduced to the resist islands 218, the properties of the patterned resist islands 218 may be altered symmetrically or asymmetrically. For example, the incident angle of the particles 224 may be controlled such that the resist 218 may preferentially shrink laterally, that is, so the resist exhibits a greater decrease in width than in height. For example, if a top surface imaging resist or a top coated resist is used, the sides of the resist may be different, which, in turn may be implanted in a way to cause a lateral shrink that is more than a vertical shrink. In some embodiments, by using a series of four particle exposures, the top of the resist effectively "sees" four exposures, while the sidewall sees only two exposures. In cases in which a substrate twist is utilized, two exposures may be employed to expose all four sides of a resist islands 218 (back sides of resist islands 218 are not shown). In the case of using two particle exposures to expose all sides of resist islands 218, the tops top see both exposures, while each resist sidewall sees only one exposure. If the tilt angle is high enough, the relative etch rate of the top surface may be substantially different than the sidewall etch rate, leading to differential lateral shrinkage of islands 218 noted above. If desired, the incident angle may be also be controlled to induce asymmetrical hardness.

Moreover, if non-electrically active or inert particles are introduced, properties of the resist islands 218 may be altered without adversely affecting the electrical properties layers below the resist 218. In addition, by carefully managing the interaction between the polymer in the resist 218 and the particles 224, the resist 218 may be used as the critical dimension shrinking process instead of one or more etch trimming steps as is traditionally used. Further, adverse optical affects associated with EUV or soft x-ray photolithographic process may be avoided. In the processes described hereinabove, a much more uniform resist island 218 structure may be formed. Further, numerous deposition and etch processes associated with conventional SADPL process may be avoided with the present technique. As such, the present invention offers a more simple integration flow and also a lower cost implementation.

Herein, a novel and inventive technique for patterning process is disclosed. The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. For example, although embodiments of the present invention described hereinabove have been generally directed to a stack of processing layers that includes ACL and SiON layers, the present invention can be implemented without said layers or with additional layers. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of patterning a substrate, comprising:
   providing an array of resist features on a surface of said substrate, said array defined by a first pitch and a first gap width between adjacent resist features, wherein each resist feature comprises a top portion and side portions;
   introducing particles into said array of resist features, wherein said array of resist features becomes hardened;
   depositing a spacer material on said surface, said top portions and said side portions, after said introducing;
   removing portions of said spacer material, wherein said top portions and portions of said surface are exposed and wherein said spacer material remains disposed along said side portions, forming sidewalls; and
   removing said hardened array of resist features wherein an array of isolated sidewalls that are disposed on said surface of said substrate is formed.

2. The method of claim 1, further comprising:
etching exposed portions of said substrate; and
removing said sidewalls, wherein said etched substrate comprises an array of substrate features having a second pitch equal to half the first pitch.

3. The method of claim 2, wherein said substrate comprises:
an antireflection layer having an upper surface comprising said surface;
an upper layer comprising an SiON material and disposed under said antireflection layer;
an intermediate layer comprising a carbon material and disposed under said upper layer;
a hard mask layer disposed under said intermediate layer;
a lower portion of said substrate disposed under said hard mask layer; and
a base portion of said substrate disposed under said lower portion of said substrate.

4. The method of claim 2, wherein said substrate comprises:
an upper layer comprising an SiON material having an upper surface comprising said surface;
an intermediate layer comprising a carbon material and disposed under said upper layer;
a hard mask layer disposed under said intermediate layer;
a lower portion of said substrate disposed under said hard mask layer; and
a base portion of said substrate disposed under said lower portion of said substrate.

5. The method of claim 4, wherein said substrate comprises a silicon wafer, said lower portion comprises one or more of: a polysilicon layer, a metal layer, and an insulating layer, and said array of substrate features comprises one or more of: polysilicon, metal, and an insulator.

6. The method of claim 1, wherein said particles comprise one of: charged particles and neutral particles, and wherein said particles comprise one of: sub-atomic, atomic, and molecular particles.

7. The method of claim 6, wherein said particles are introduced into said array of resist features by one of: a beam-line ion implantation system, a plasma assisted doping (PLAD) system, a plasma immersion ion implantation (PIII) system, a furnace, a chemical vapor deposition (CVD) system, a plasma enhanced chemical vapor deposition (PECVD) system, an atomic layer deposition (ALD) system, and a molecular beam epitaxy (MBE) system.

8. The method of claim 6, wherein said particles comprise a kinetic energy in the range of about 100 eV to about 100 KeV when introduced into said patterned resist.

9. The method of claim 6, wherein said particles are introduced at a tilt angle with respect to said substrate.

10. The method of claim 6, wherein said particles are one of: helium (He), neon (Ne), argon (Ar), krypton (Kr), xenon (Xe), radon (Rn), nitrogen (N), oxygen (O), silicon (Si), boron (B), hydrogen (H), carbon (C), iron (Fe), lithium (Li), chromium (Cr), nickel (Ni), Arsenic (As) and carborane.

11. The method of claim 9, wherein said substrate comprises silicon, and wherein said particles are one of: Helium (He), Neon (Ne), Argon (Ar), Krypton (Kr), Xenon (Xe), Radon (Rn), Nitrogen (N), and Oxygen (O).

12. The method of claim 9, wherein a kinetic energy of said particles and said tilt angle are arranged so as to form hardened resist features that comprise a hardened outer portion disposed along said side and said top portions and a substantially unhardened inner portion disposed inside a region defined by the outer portion and said substrate.

13. The method of claim 9, wherein a kinetic energy of said particles and said tilt angle are arranged to cause a substantial reduction in critical dimension of said resist features, wherein said adjacent resist features are separated by a second gap width that is greater than the first gap width after said particles are introduced into said array of resist features.

14. The method of claim 9, wherein, during a first period, said particles are introduced at a first twist angle with respect to said substrate.

15. The method of claim 14, wherein, after said first period, in each of one or more subsequent periods, said substrate is rotated to form a second twist angle that forms an angle with the first twist angle of greater than 0° to about 90°.

16. A method of patterning a substrate, comprising:
providing an array of resist features defined by a first pitch and at least a first gap width between adjacent resist features, wherein each resist feature comprises a top portion and side portions;
arranging the substrate to receive a flux of particles at a tilt angle of about 5 to 85 degrees and a twist angle of about 5 to 85 degrees;
providing a kinetic energy and a dose for the particles that is sufficient to form a hardened outer layer in the resist features that is capable of withstanding high temperature processing; and
providing a sufficient flux of particles to cause a substantial reduction in a critical dimension of said resist features wherein said adjacent resist features are separated by a second gap width that is greater than said first gap width after exposure to the flux of particles.

17. The method of claim 16, further comprising one or more of:
arranging said tilt angle and twist angle to cause preferential lateral shrinkage of said resist features; and
arranging said tilt angle and twist angle to cause asymmetrical hardness in the resist features.

* * * * *